United States Patent [19]

Katakura et al.

[11] Patent Number: 4,498,053
[45] Date of Patent: Feb. 5, 1985

[54] CURRENT AMPLIFIER

[75] Inventors: Masayuki Katakura, Yokohama; Takumi Tenma, Atsugi, both of Japan

[73] Assignee: Sony Corporation, Tokyo, Japan

[21] Appl. No.: 506,700

[22] Filed: Jun. 22, 1983

[30] Foreign Application Priority Data

Jun. 28, 1982 [JP] Japan .................... 57-109753

[51] Int. Cl.$^3$ .................................... H03F 3/45
[52] U.S. Cl. .................................. 330/261; 330/259
[58] Field of Search ............. 330/252, 254, 258, 259, 330/261, 85

[56] References Cited

U.S. PATENT DOCUMENTS 3,641,450  2/1972  Lunn ............................ 330/254

FOREIGN PATENT DOCUMENTS

47467  4/1979  Japan .......................... 330/261

Primary Examiner—James B. Mullins
Assistant Examiner—G. Wan
Attorney, Agent, or Firm—Lewis H. Eslinger; Alvin Sinderbrand

[57] ABSTRACT

A current amplifier for use with an input voltage comprises a current to voltage converting circuit which converts the input voltage to output currents, and a current multiplier circuit which multiplies the output currents from the voltage to current converting circuit. The voltage to current converting circuit includes first and second transistors each having base, collector and emitter electrodes, with the base electrodes of the first and second transistors being respectively connected to first and second input terminals receiving the input voltage, third and fourth transistors and having base, collector and emitter electrodes, with the base electrodes of the third and fourth transistors being respectively connected to the emitter electrodes of the first and second transistors, each of the third and fourth transistors supplying one of the output currents, a resistor connected between the emitter electrodes of the third and fourth transistors, and a bias current source which supplies a bias current to the resistor. The current multiplier circuit includes a current inverting circuit and a feedback circuit connected between the converting circuit and the current inverting circuit.

19 Claims, 10 Drawing Figures

CURRENT AMPLIFIER

BACKGROUND OF THE INVENTION

1. Field of the Invention

This invention relates to current amplifiers, and more particularly, to a current amplifier providing an output current corresponding to the difference between input voltage signals supplied across a pair of differential input terminals.

2. Description of the Prior Art

Certain circuits, such as variable impedance circuits, voltage amplifiers, voltage-to-current converters having electrically controllable gains, and instrument amplifiers which remove in-phase components from a balanced signal and convert the balanced signal into an unbalanced signal, include current amplifiers with multiplier circuits and voltage to current converters having differential inputs and differential outputs for amplifying currents supplied thereto. One such prior art current amplifier is described, for example, in SC-8, No. 4, IEEE JOURNAL OF SOLID STATE CIRCUITS, pp. 275-282 (August 1973). The current amplifier described in the IEEE JOURNAL is subject to fluctuations in the conversion factor, i.e., the ratio of the output current to the input voltage, and also to nonlinear components in the output signal. Accordingly, severe limitations are placed on the operating range and temperature of the disclosed amplifier.

The current amplifier disclosed in the IEEE JOURNAL is, however, well suited to an integrated circuit configuration because of improved thermal coupling and compatibility among the circuit elements. However, the transconductance of the circuit is not constant because the absolute value thereof depends upon the absolute value of the diffused resistance in the integrated circuit. The value of the diffused resistance, i.e., the resistor obtained by a diffusion process performed on the integrated circuit, fluctuates about plus or minus 20 percent. The diffused resistance also exhibits a temperature dependency on the order of about 1500 ppm/deg., so that the transconductance of the current amplifier in an integrated circuit configuration is subject to similiar fluctuations in its absolute value and exhibits a similar dependence on temperature.

Variations in the absolute value of the transconductance and in temperature do not pose problems for a current amplifier comprising a portion of a larger circuit contained completely within an integrated circuit. However, a very stable transconductance absolute value is important for a voltage amplifier in which the current output from the integrated circuit is converted into voltage by coil, capacitor or resistor elements which are disposed outside the circuit, or for a circuit in which the current amplifier is used as a variable impedance circuit for effectuating programmable frequency or filter characteristics.

Since the absolute value of the diffused resistance in an integrated circuit fluctuates about plus or minus 20 percent, and the transconductance of a current amplifier comprising an integrated circuit is primarily affected by the diffused resistance, a current amplifier constructed as a current output type integrated circuit is not completely satisfactory because its operation may be undesirably affected by fluctuations in the value of the diffused resistance.

OBJECTS AND SUMMARY OF THE INVENTION

It is therefore an object of the present invention to provide a current amplifier in which the output current is not affected by the transistor base to emitter voltage of a voltage to current converter.

It is another object of the present invention to provide a current amplifier in which the voltage to current conversion ratio is determined solely by the resistance therein.

It is still a further object of the present invention to provide a current amplifier in which the effects of the base current of a common emitter transistor configuration pair in a multiplier circuit can be eliminated, thereby improving the linearity and precision of the multiplying factor of the circuit.

It is still a further object of the present invention to provide a current amplifier as an integrated circuit with a transconductance which is not dependent on the absolute value of the diffused resistance, but rather, is dependent on the relative value thereof which can fluctuate within about plus or minus 2 percent, whereby the transconductance of the entire circuit is an accurate and stable value. Accordingly, an integrated circuit can be manufactured under less stringent conditions and at an improved yield rate as compared with prior art current amplifiers.

In accordance with the present invention, a current amplifier for use with an input voltage comprises a converting means for converting the input voltage to output currents and including first and second transistors each having base, collector and emitter electrodes, the base electrodes of the first and second transistors being respectively connected to first and second input terminals receiving the input voltage, third and fourth transistors each having base, collector, and emitter electrodes, the base electrodes of the third and fourth transistors being respectively connected to the emitter electrodes of the first and second transistors, each of the third and fourth transistors supplying one of the output currents, resistor means connected between the emitter electrodes of the third and fourth transistors, bias current means for supplying a bias current to the resistor means, and multiplier means for multiplying the output currents from the converting means and including current inverting means and feedback means connected between the converting means and the current inverting means.

The above, and other objects, features and advantages of the present invention will be apparent from the following detailed description of illustrative embodiments thereof which is to be read in connection with the accompanying drawings.

DESCRIPTION OF THE PREFERRED EMBODIMENTS

Figure 1:
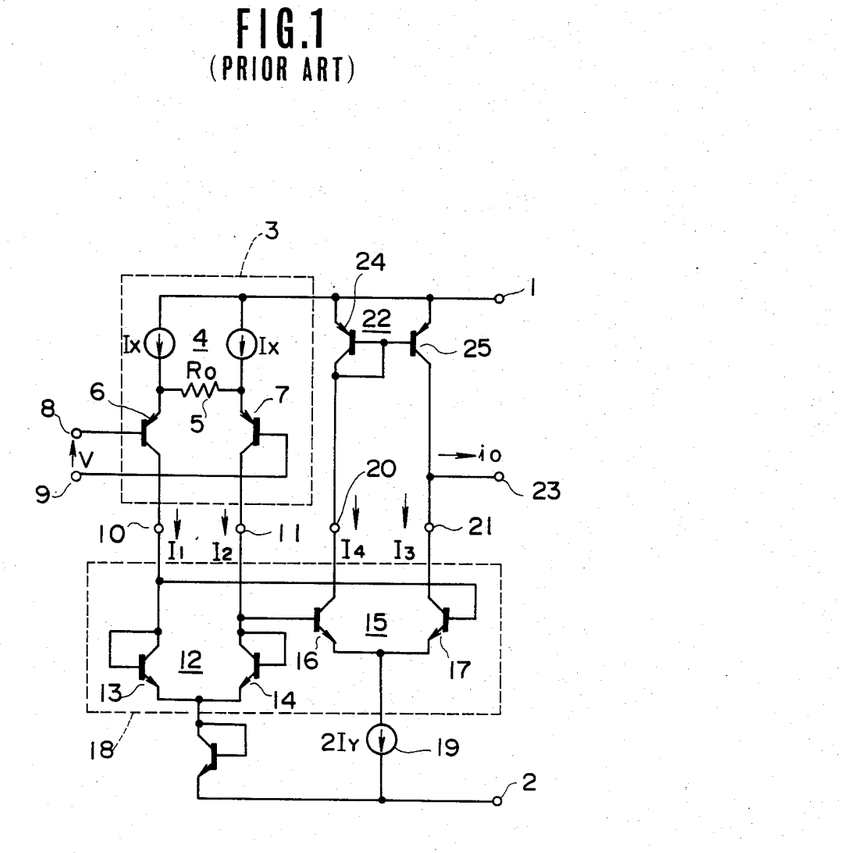
FIG. 1 is a circuit diagram illustrating a prior art current amplifier.

Referring to the drawings, and initially to FIG. 1 thereof, a prior art current amplifier includes a terminal 1 of a positive voltage source and a terminal 2 of a negative voltage source. A voltage to current converting circuit 3 with differential inputs and differential outputs includes a resistor 5 having a resistance value $R_0$ connected across the output terminals of a pair of current sources 4 which supply equal currents $I_x$. A pair of PNP transistors 6, 7 have emitter electrodes connected to the junction points between current sources 4 and resistor 5. In the illustrated circuit, a differential input voltage v is supplied to terminals 8, 9 and thence, to transistors 6, 7, where it is converted into currents $I_1$, $I_2$ which are supplied to differential output terminals 10, 11 comprising the collector electrodes of transistors 6, 7.

Output currents, $I_1$, $I_2$ are respectively supplied to NPN transistors 13, 14 comprising a PN junction pair 12. The base electrodes of transistors 13, 14 are connected to the respective collector electrodes which constitute the anodes of PN junction pair 12. The emitter electrodes of transistors 13, 14 are connected as diodes and constitute the cathodes of PN junction pair 12. The emitter electrodes of transistors 13, 14 are connected in common and to current sources 4.

The anodes of PN junction pair 12 are connected to the base electrodes of NPN transistors 16, 17 which comprise a common emitter configuration transistor pair 15. PN junction pair 12 and common emitter configuration transistor pair 15 comprise a multiplier circuit 18.

A current source 19 is connected to the common emitter electrodes of common emitter configuration transistor pair 15 and delivers a current $2I_y$ which defines a multiplier coefficient of multiplier circuit 18. A current inverting or current mirror circuit 22 is connected to output terminals 20, 21 of multiplier circuit 18. The difference between collector output currents $I_3$, $I_4$ transistors 16, 17 comprising common emitter configuration transistor pair 15 is delivered as output current $i_0$ to an output terminal 23. Output current $I_4$ at output terminal 20 is inverted in polarity by current inverting circuit 22 so that the difference between output currents $I_3$, $I_4$ from output terminals 20, 21 appears at output terminal 23 as output current $i_0$. In the illustrated embodiment, current inverting circuit 22 comprises a pair of PNP transistors 24, 25 with the base electrodes thereof connected together. The base and collector electrodes of transistor 24 are connected together.

Output currents $I_1$, $I_2$ of voltage to current converting circuit 3 are defined by the following equations:

$$I_1 \approx I_x - v/R_0 \quad (1)$$

$$I_2 \approx I_x + v/R_0 \quad (2)$$

Output currents $I_3$, $I_4$ from multiplier circuit 18 are defined by:

$$I_3 = I_1(I_Y/I_x) \quad (3)$$

$$I_4 = I_2(I_Y/I_x) \quad (4)$$

Output current $i_0$ can be derived from equations 1 through 4, and is defined by:

$$i_0 = I_4 - I_3 = 2v \, I_Y/I_x R_0 \quad (5)$$

The circuit of FIG. 1 converts a voltage difference across differential input terminals 8, 9 into an output current. The conversion factor of the input voltage to the output current is controlled by current $I_y$ from current source 19. The circuit of FIG. 1 has an effective transconductance equal to $2 I_y/I_x R_0$. The magnitude of the transconductance depends on the current ratio $I_y/I_x$ and the value of resistance $R_0$.

It is to be appreciated that the current amplifier of FIG. 1 suffers from noticeable drawbacks. First, the magnitudes of output currents $I_1$, $I_2$ in equations 1 and 2 are not determined solely by the values of v and $R_0$, since it is also necessary to consider changes in the base electrode to emitter electrode voltage caused by changes in the collector current through transistors 6, 7. The resulting conversion factor or coefficient is not precisely fixed, and nonlinear components can also be produced in the output signal.

A second drawback in the amplifier depicted in FIG. 1 is that output currents $I_1$, $I_2$ flow through transistors 13, 14 and also through transistors 16, 17 of common emitter configuration transistor pair 15 as base electrode currents. Thus, if the conversion factor is set to a larger value by selecting the current ratio so that $I_y$ is very much greater than $I_x$, the magnitude of the base currents of common emitter configuration transistor pair 15 is no longer negligible. The base currents introduce nonlinear components in the output current, reducing the accuracy of the conversion from voltage to current. Additionally, if the current ratio $I_y/I_x$ exceeds the current amplification factor $\beta$ of transistors 16, 17 in common emitter configuration transistor pair 15, the current amplifier will not operate normally. This imposes pronounced limitations on the operating range and temperature range of the prior art current amplifier circuit.

Figure 2:
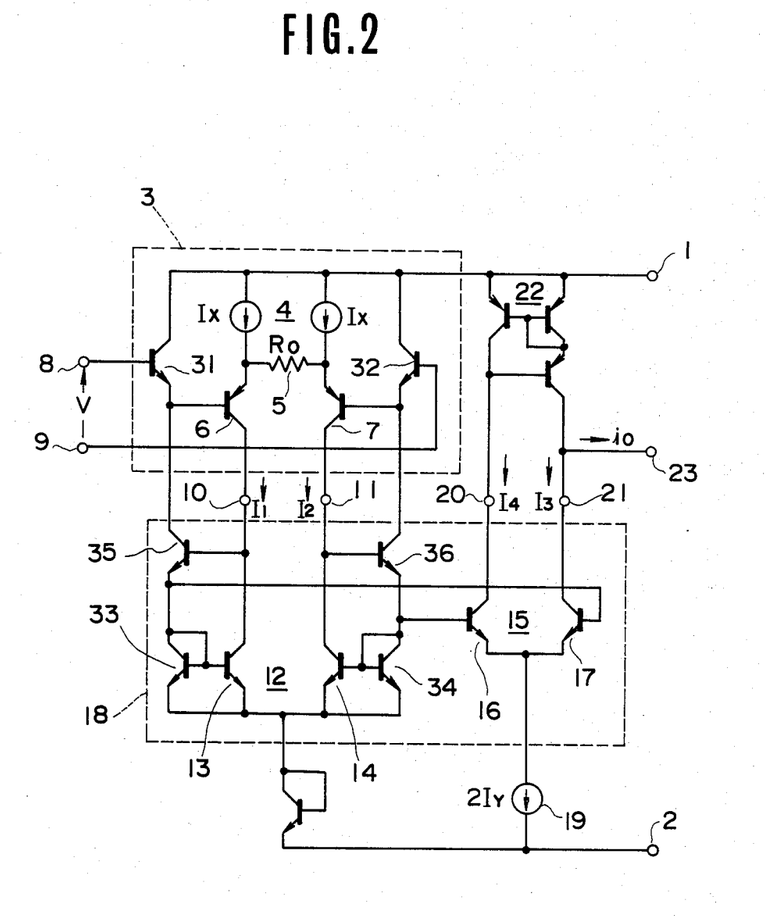
FIG. 2 is a circuit diagram illustrating one embodiment of a current amplifier in accord with the present invention.

The embodiment of FIG. 2 of a current amplifier in accord with the present invention includes terminal 1 for a positive voltage source and terminal 2 for a negative voltage source. Voltage to current converting circuit 3 of the illustrated embodiment includes a differential input and a differential output and a pair of current sources 4 each supplying equal currents $I_x$. Voltage to current converting circuit 3 includes resistor 5, having a resistance value $R_0$, connected across the output terminals of current sources 4. PNP transistors 6, 7 have emitters connected to the junction points between the output terminals of current sources 4 and resistor 5 and convert the voltage from input terminals 8, 9 to a current. The base electrodes of NPN transistors 31, 32 are connected to first and second input terminals 8, 9, while the emitter electrodes thereof are connected to the base electrodes of PNP transistors 6, 7. NPN transistors 31, 32 act as emitter followers for driving PNP transistors 6, 7, respectively. PNP transistors 6, 7 supply collector output currents $I_1$, $I_2$ to the collector electrodes of NPN transistors 13, 14 comprising a PN junction pair 12 included in multiplier circuit 18. Unlike the circuit of FIG. 1, transistors 13, 14 are not connected as diodes. NPN transistors 33, 34, however, are connected as diodes, with their base electrodes connected to the corresponding collector electrodes. NPN transistors 33, 34, provide respective current inverting or current mirror circuits. The base electrodes of transistors 13, 14 are connected to the emitter electrodes of transistors 35, 36. The base electrodes of transistors 35, 36 are connected to the collector electrodes of transistors 13, 14. The collector electrodes of transistors 35, 36 are connected to the emitter electrodes of transistors 31, 32.

The emitter electrodes of transistors 35, 36 are connected to the base electrodes of transistors 16, 17 comprising a common emitter configuration transistor pair 15. A constant current source 19 supplying a current $2I_y$ is connected to the common emitter path of transistors 16, 17. The collector electrodes of transistors 16, 17 function as output terminals 20, 21 for multiplier circuit 18. Output terminals 20, 21 are connected to a current inverting or current mirror circuit 22 so that the difference between output currents $I_3$, $I_4$ is supplied as output current $i_0$ at an output terminal 23.

In the illustrated embodiment, transistors 35, 36 comprise a feedback circuit for counterbalancing the collector currents $I_1$, $I_2$ of transistors 6, 7 and the collector currents of transistors 13, 14. At the same time, transistors 35, 36 preset the operating currents for transistors 31, 32.

Each transistor pair 13, 33 and 14, 34 comprises a current inverting or current mirror circuit. Accordingly, the current flowing through transistors 6, 31 is maintained at all times at a predetermined ratio relative to the current of each of transistors 6, 31. The same conditions hold true for the currents flowing through transistors 7, 32. The current ratio is set by the base electrode to emitter electrode saturation current ratio, that is, the emitter area ratio of transistor pair 13, 33 or transistor pair 14, 34. For example, with a current ratio equal to unity, transistors 6, 31 are operated at an approximately equal current. The same conditions also hold true for transistors 7, 32. Accordingly, changes in the base to emitter voltages of transistors 31, 32 cancel corresponding voltage changes in transistors 6, 7 caused by changes in currents $I_1$, $I_2$ associated with input voltage v. Thus, changes in the voltage across input terminals 8, 9 are transmitted accurately to both ends of resistor 5 to improve the accuracy of the conversion of voltage v into currents $I_1$, $I_2$, as represented by equations 1 and 2 above.

Since the base to emitter voltage of a transistor is a logarithmic function of the emitter current, the effects mentioned above apply even when the saturation current ratio for transistor pair 13, 33 or pair 14, 34 is not equal to unity.

It is to be appreciated that the currents of transistors 13, 14, 33, 34 are not affected by the base currents of common emitter pair 15, as these base currents are supplied from transistors 35, 36. Therefore, the conversion factor can be set to a larger value by using a larger current ratio ($I_y$ is very much greater greater $I_x$) without causing unusual circuit operation, fluctuations in the value of the conversion factor or nonlinear components in the output current.

Figure 3:
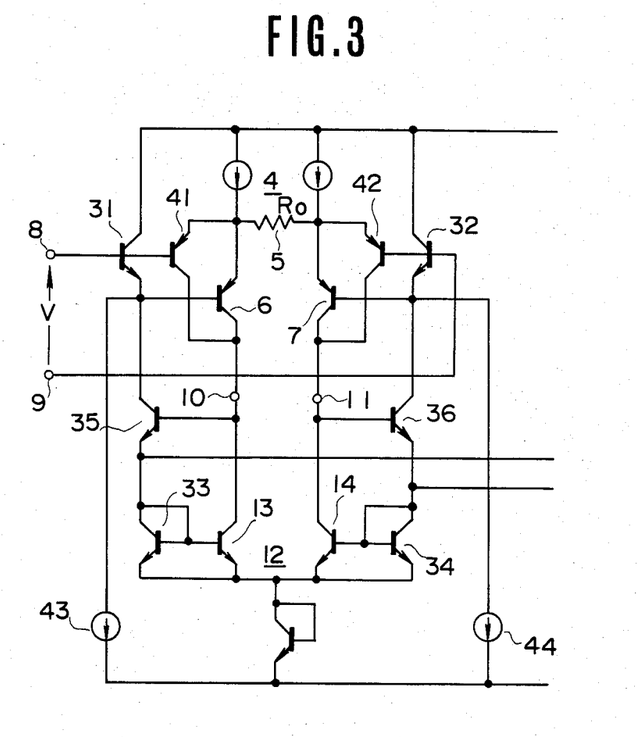
FIG. 3 is a circuit diagram illustrating a portion of a second embodiment of a current amplifier in accord with the present invention.

While the first embodiment of a current amplifier in accord with the present invention operates normally during its steady-state operation, it cannot be started smoothly when a main power switch is turned on. Accordingly, the second embodiment of FIG. 3 includes a starting circuit to overcome such a difficulty. The same or similar parts or elements of FIGS. 2 and 3 are indicated by the same reference numerals, and a description thereof is omitted for ease of presentation. The embodiment of FIG. 3 has additionally omitted the output stage of multiplier circuit 18 for simplicity.

In the embodiment of FIG. 3, PNP transistors 41, 42 have base electrodes connected to differential input terminals 8, 9 and comprise a first starting circuit. The emitter electrodes of transistors 41, 42 are connected to the junction points between resistor 5 and the emitter electrodes of transistors 6, 7 while the collector electrodes thereof are connected to the collector electrodes of transistors 6, 7. Transistors 41, 42 are not operated during steady-state operation of the circuit, but rather, operate only at the starting time as, for example, when the main power switch is actuated.

Current sources 43, 44 are connected to the junction points between the base electrodes of transistors 6, 7 and the emitter electrodes of transistors 31, 32, and comprise a second starting circuit. Current sources 43, 44 prevent transistors 31, 32 from being turned off completely when transistors 6, 7 are in an OFF state. A starting current of approximately 10 to 100 nA was enough, in one practical construction, to satisfy the starting conditions for the transistors. Such a starting current is, of course, almost negligible with regard to the currents flowing through the circuit of FIG. 3 during its steady-state operation.

It is to be appreciated that the embodiment of FIG. 3 operates in a similar fashion to the embodiment of FIG. 2, and a description thereof is not repeated here for the sake of brevity.

Figure 4:
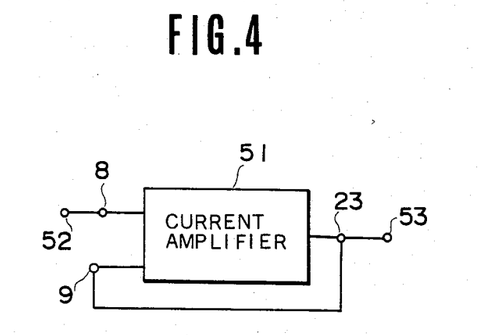
FIG. 4 is a block diagram illustrating an application of a current amplifier in accord with the present invention.

FIG. 4 illustrates one application of the embodiments of the current amplifiers in FIGS. 2 and 3. In FIG. 4, the current amplifier in accord with the present invention is indicated by reference numeral 51. A feedback path is provided between differential input terminal 9 and output terminal 23, as shown in FIGS. 2 and 3, thereby comprising a variable resistance circuit. The variable resistance circuit has an input terminal 52 and an output terminal 53 which correspond to input and output terminals 8, 23 of the current amplifier of FIGS. 2 and 3.

Figure 5:
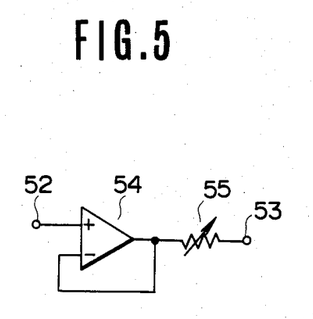
FIG. 5 is a circuit diagram illustrating an equivalent circuit to the circuit of FIG. 4.

FIG. 5 illustrates an equivalent circuit to the circuit of FIG. 4 as viewed from input and output terminals 52, 53. The circuit of FIG. 5 comprises a series connection of a buffer amplifier 54 and a variable resistor 55. The equivalent resistor may have its resistance value controlled by the current source, thus providing an ungrounded variable resistance circuit.

One skilled in the art will recognize that the present invention is susceptible to numerous modifications. For example, a current amplifier in accord with the first and second embodiments of the present invention can include a plurality of common emitter configuration transistor pairs in the multiplier circuit, thus providing a plurality of output currents. In addition, the PNP and NPN transistors can be exchanged for one another. Finally, the twin current sources described herein can be replaced by a shunted single current source.

It is to be further appreciated from the foregoing that the embodiments of the current amplifiers of FIGS. 2 and 3 prevent changes in the base to emitter voltage of the transistors in the voltage to current converting circuit from affecting the performance of the amplifier. The conversion factor in the multiplier circuit depends only on the relative resistance values of the circuit, and not the absolute resistance value. In addition, the linear qualities of the multiplier circuit are improved as compared to prior art current amplifiers. At the same time, the effects of the base currents of the common emitter transistor configuration pair are eliminated, thus improving the accuracy of the conversion factor. Finally, the current ratio $I_y/I_x$ can be selected to be a larger value than the value heretofore used in prior art current amplifiers without affecting circuit performance.

Figure 6:
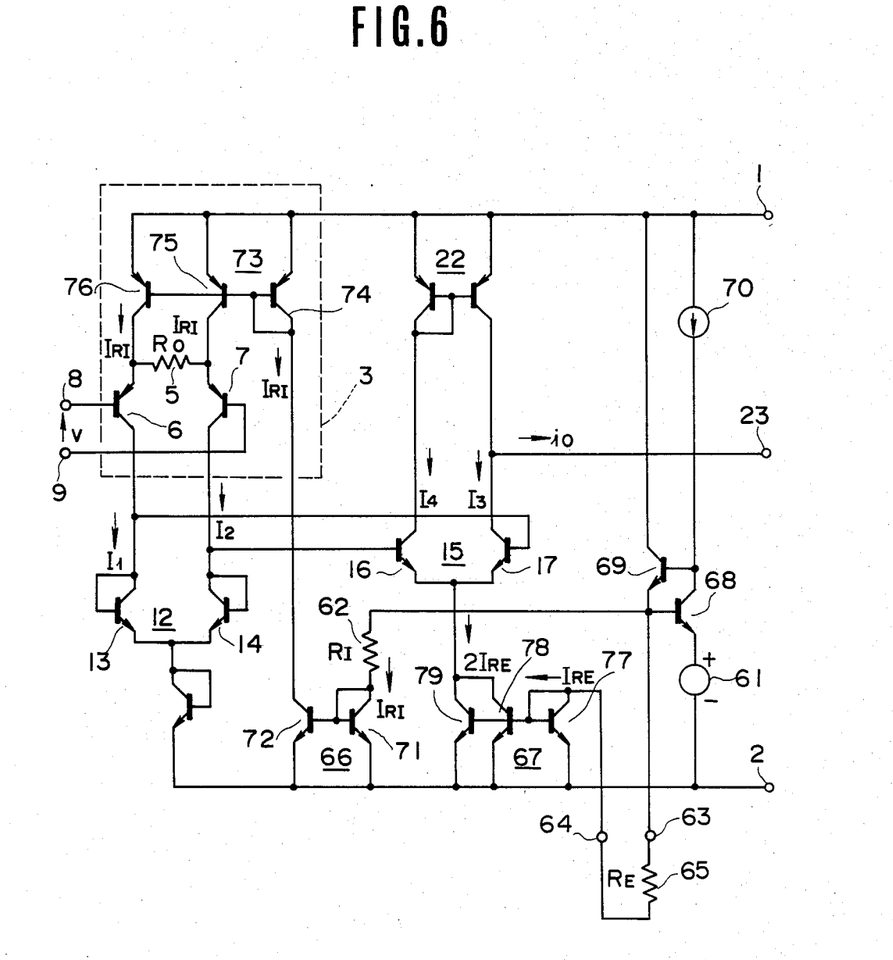
FIG. 6 is a circuit diagram showing another form of current amplifier.

FIG. 6 illustrates another form of a current amplifier including a voltage to current converting circuit and a multiplier according to the prior art, in which the same or similar parts or elements shown in FIG. 1 are identified by the same reference numerals, and the corresponding description is omitted for the sake of brevity.

In FIG. 6, a reference voltage source 61 utilizes the forward voltage drop of a PN junction in the integrated circuit to produce an internal reference current $I_{RI}$ and an external reference current $I_{RE}$. More specifically, reference voltage source 61 and an internal reference resistance 62 provided by a diffused resistance in the integrated circuit supply internal reference current $I_{RI}$. Although the absolute value $R_I$ of internal reference resistance 62 is approximately accurate to plus or minus 20 percent, the ratio of this resistance value to the diffused resistance value of the entire integrated circuit is accurate to about plus or minus 2 percent.

Reference voltage source 61 and an external reference resistor 65, located outside the integrated circuit and connected between a reference voltage terminal 63 and a reference current terminal 64, determine external reference current $I_{RE}$. The resistance value $R_E$ of external reference resistor 65 is accurate to within plus or minus a few percent. One end of internal reference resistor 62 and one end of external reference resistor 65 are connected to reference voltage terminal 63, while the other ends of resistors 62, 65 are respectively connected to current inverting or current mirror circuits 66, 67. NPN transistors 68, 69 and current source 70 cancel the forward voltage drop of the diode comprising an input stage of current inverting circuits 66, 67. The sum of the voltage drop across reference voltage source 61 and the forward diode voltage drop is supplied to reference voltage terminal 63. Accordingly, the voltage from reference voltage source 61 is supplied substantially unchanged to the internal and external reference resistors 62, 65.

Current inverting circuit 66 comprises NPN transistors 71, 72 and has an output terminal (the collector electrode of transistor 72) connected to an input terminal of current inverting or current mirror circuit 73. Current inverting circuit 73 is of the dual output type and comprises transistors 74, 75, 76. Current inverting circuit 73 supplies current $I_{RI}$ from the collector electrodes of transistors 75, 76. (Output current $I_{RI}$ corresponds to current $I_x$ described with reference to FIGS. 2 and 3).

The output terminals of current inverting circuit 73 are connected to both terminals of resistor 5. Therefore, a steady state internal reference current $I_{RI}$ ($I_x$ in the embodiments of FIGS. 2 and 3) is supplied by transistors 6, 7 of the differential input and differential output type voltage to current converting circuit 3, similarly to the description of the circuit of FIG. 1. Current inverting circuit 67 comprises NPN transistors 77, 78, 79, in which the collector electrode and the base electrode of transistor 77 are connected together to function as a current input terminal. The collector electrodes of transistors 78, 79 are connected in common and function as an output terminal from which a current $2I_{RE}$, equal to twice external reference current $I_{RE}$, is supplied. This output terminal is connected to the common emitter of common emitter configuration transistor pair 15.

Output current $i_0$ in the embodiment of FIG. 6 is equal to the output current in the prior art circuit illustrated in FIG. 1 when currents $I_x$, $I_y$ are substituted for $I_{RI}$, $I_{RE}$ respectively. Thus, from equation 5, $$i_0 = 2v \, I_{RE}/I_{RI}R_0 \tag{6}$$

Accordingly, the transconductance of the embodiment of FIG. 6 is equal $2I_{RE}/I_{RI}R_0$. The ratio $I_{RE}/I_{RI}$ for the transconductance value is determined by the resistance ratio of external reference resistor 65 and internal reference resistor 62. Rewriting equation 6 using this resistance ratio, one calculates $i_0$ as:

$$i_0 = 2v \, R_I/R_E R_0 \tag{7}$$

The transconductance of such a circuit is $2R_I/R_E R_0$. In equation 7, $R_I$ and $R_0$ represent the resistance values of resistors 5, 6 formed on the integrated circuit through a diffusion method or the like. Although the absolute values of these resistors change appreciably with changes in temperature and/or manufacturing conditions, since the current amplifier of the present invention deals with an integrated circuit, the ratio $R_I/R_0$ remains a stable and precise value. If the ratio $R_I/R_0$ is expressed as a constant K, equation 7 can be rewritten as $$i_0 = 2v \, K/R_E \tag{8}$$

Thus, the output current can be determined by the ratio of the diffused resistances in the integrated circuit and the resistance $R_E$ of external reference resistance 65. Accordingly, the transconductance $2K/R_E$ can be accurately determined since it is not dependent on the absolute value of a diffused resistance on an integrated circuit which is, as noted above, of low accuracy and stability. As a result, an integrated circuit of improved performance can be manufactured under less stringent manufacturing conditions and with an improved yield rate as compared to prior art current amplifiers.

Figure 7:
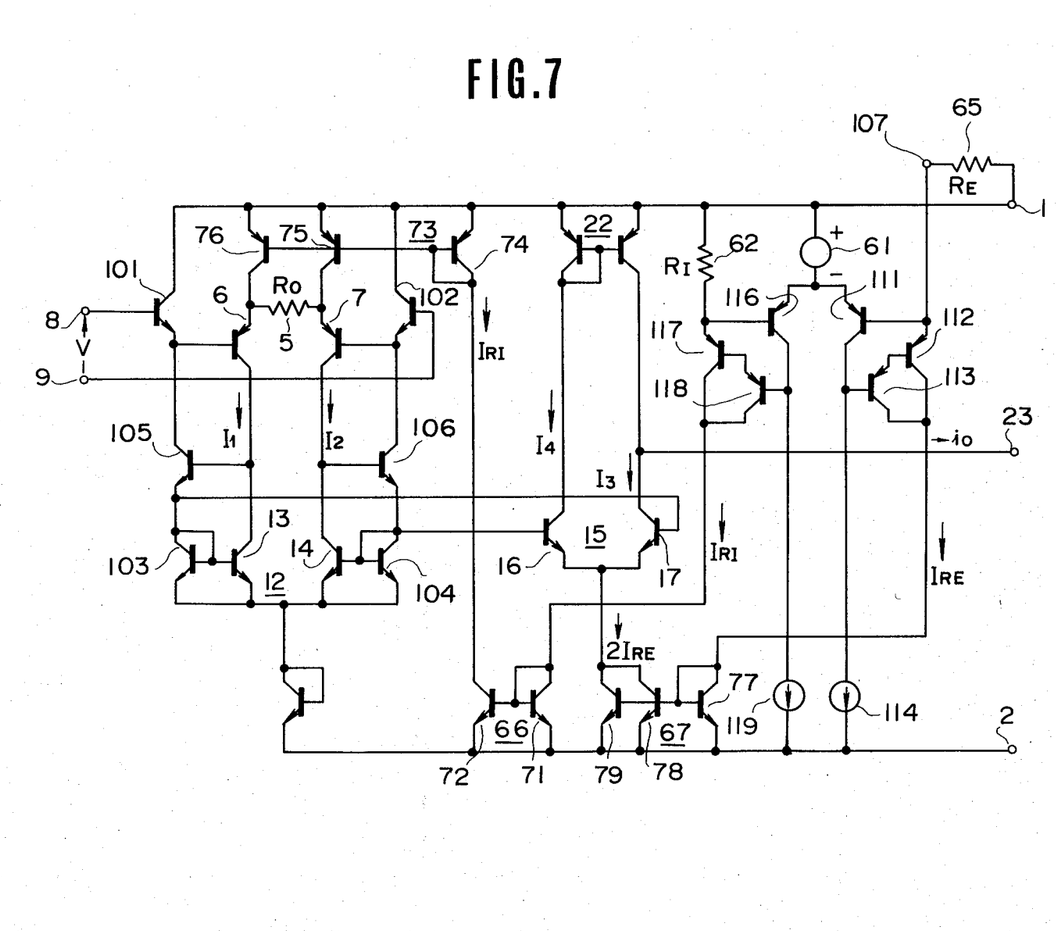
FIG. 7 is a circuit diagram illustrating the application of another embodiment of the invention to the type of current amplifier shown on FIG. 6.

FIG. 7 illustrates a third embodiment of a current amplifier in accord with the present invention in which the same or similar parts or elements of FIG. 6 indicated with same reference numerals, and the corresponding description is omitted for the sake of brevity. The embodiment of FIG. 7 differs from the embodiment of FIG. 6 in the voltage to current converting circuit, the multiplier circuit, and the reference current sources.

The voltage to current converting circuit of the embodiment of FIG. 7 comprises a first NPN transistor 101, a second NPN transistor 102, a third PNP transistor 6 and a fourth PNP transistor 7. The base electrodes of first and second transistors 101, 102 are connected to differential input terminals 8, 9, respectively. The base electrodes of third and fourth transistors 6, 7 are connected to the emitter electrodes of first and second transistors 101, 102. The emitter electrodes of first and second transistors 101, 102 are connected across a resistor 5.

The multiplier circuit of the embodiment of FIG. 7 comprises a fifth NPN transistor 105, a sixth NPN transistor 106, a seventh NPN transistor 13, and eighth NPN transistor 14, a ninth NPN transistor 103, a tenth NPN transistor 104, and a common emitter configuration transistor pair 15. The collector electrodes of the fifth and sixth transistors 105, 106 are respectively connected to the emitter electrodes of the first and second transistors 101, 102. The base electrodes of fifth and sixth transistors 105, 106 are respectively connected to the collector electrodes of third and fourth transistors 6, 7. The collector electrodes of transistors 13, 14 are connected to the base electrodes of transistors 105, 106. The base electrodes of transistors 13, 14 are connected to the emitter electrodes of transistors 105, 106, while the emitter electrodes are connected to a common path. The base and collector electrodes of transistors 103, 104 are respectively connected to the base electrodes of the seventh and eighth transistors 13, 14. The emitter electrodes of transistors 103, 104 are connected to the emitter electrodes of transistors 13, 14. The base electrodes of NPN transistors 16, 17 of common emitter configuration transistor pair 15 are respectively connected to the base electrodes of the seventh and eighth transistors 13, 14.

In operation, transistors 101, 102 function as emitter followers for driving transistors 6, 7, respectively. Transistors 13, 14, comprising a portion of PN junction pair 12, are not connected as diodes, as illustrated in the embodiment of FIG. 2. Transistors 103, 104, however, are connected as diodes, are also connected across the base and emitter electrodes of transistors 13, 14, and function as corresponding current inverting or current mirror circuits. It is to be appreciated that transistors 105, 106 comprise a feedback circuit which balances respective collector currents $I_1$, $I_2$ of transistors 105, 106 and the respective collector currents of transistors 13, 14. In addition, the operating currents of transistors 101, 102 are governed by transistors 105, 106. Since the transistor pairs 13, 103, and 14, 104 comprise current inverting or current mirror circuits, the currents flowing through transistors 6, 101 are maintained at all times at a predetermined ratio. The same conditions apply to the current flowing through transistors 7, 102.

The above-described current ratio is set by the base to emitter saturation current ratio, that is, the emitter ratio of transistor pair 13, 103 or transistors 14, 104. For example, with a current ratio equal to unity, transistors 6, 101 are operated at an approximately equal current. The same conditions apply to transistors 7, 102. The result is that changes in the base to emitter voltages of transistors 101, 102 are the same as those for transistors 6, 7 caused by changes in currents $I_1$, $I_2$ associated with input voltage v, and cancel each other out. Thus, changes in the voltage across input terminals 8, 9 are transmitted faithfully to both ends of resistor 5 to improve the accuracy of the conversion represented by equations 1 and 2, above.

As noted above, since the base to emitter voltage of a transistor is determined as a logarithmic function of the emitter current, the above conversion can be performed even when the saturation current ratio of the transistor pairs 13, 103 or 14, 104 is not equal to unity.

In addition, the currents of transistors 13, 14, 103, 104 are not affected by the base currents of the common emitter configuration transistor pair 15. These base currents are supplied by transistors 105, 106. Therefore, the conversion factor can be set to a larger value by using a larger current ratio ($I_Y$ very much greater than $I_X$) without causing unusual circuit operation or fluctuations in the value of the conversion factor as compared to the prior art current amplifiers. In addition, nonlinear components in the output current are effectively eliminated.

The circuit for generating the reference currents will next be described with reference to the embodiment illustrated in FIG. 7. Referring, however, briefly to FIG. 6, when the amplifier circuit comprises an integrated circuit, two connection pins are required to produce external reference current $I_{RE}$, i.e., one pin for reference voltage terminal 63 and one pin for reference current terminal 64, to which external reference resistor 65 is connected. In the embodiment of FIG. 7, on the other hand, only one terminal 107 is used for the connection to the external resistor. Thus, reference voltage source 61 has one end connected to terminal 1 of the positive voltage source and the other end connected to the emitter electrode of a PNP transistor 111, whereby a reference voltage is produced between terminal 1 and a terminal 107 which is equal to the sum of the voltages across reference voltage source 61 and the base to emitter voltage of transistor 111. This voltage is applied across external reference resistor 65 and produces an external reference current $I_{RE}$ which is supplied to the integrated circuit from terminal 107.

In the embodiment of FIG. 7, PNP transistors 111, 112, 113 and current source 114 comprise a circuit which cancels the forward voltage drop of the diode comprising the input stage of current inverting circuit 67, i.e., the circuit functions in a similar fashion as transistors 68, 69 and current source 70 of FIG. 6. In addition, NPN transistors 116, 117, 118 and a current source 119 comprise an internal reference current generating circuit which is similar to the external reference current generating circuit. In the embodiment of FIG. 7, only one connecting pin (terminal 107) is required to produce external reference current $I_{RE}$, thus enhancing the flexibility of the integrated circuit package.

It is to be appreciated that, in the circuits of FIGS. 6 and 7, the portion of the circuit which performs the current amplification can be formed separately from the portion which produces the reference current, and the two portions can be subsequently combined to form the desired circuit.

In the amplifier circuit of the present invention, three methods can be used to generate a reference voltage within the integrated circuit. The first method is to use a forward voltage drop of a PN junction, for example, the voltage $V_{BE}$ of a transistor. This is a relatively simple method of providing the reference voltage because of a large temperature coefficient associated with a transistor.

A second method of generating the reference voltage is to use the breakdown voltage of a PN junction, such as a Zener diode.

A third method of generating the reference voltage is to utilize a band gap reference using the thermal voltage $V_T (=kT/q)$ and $V_{BE}$.

A reference voltage generated outside the integrated circuit can be supplied to reference voltage terminal 63 (see FIG. 6). In addition, when the voltage supplied to the integrated circuit is stable, the source voltage, whether divided or not, can be used as a reference voltage.

A current amplifier in accord with the present invention can, with suitable modifications, deliver a plurality of output currents by the addition of a plurality of common emitter configuration transistor pairs 15 connected to PN junction pair 12.

When current amplifiers are used for a plurality of channels in the same integrated circuit chip as, for example, the left and right channels of a stereo sound system, only a single reference current source need be supplied in the embodiment of FIG. 7 since a plurality of current inverting or current mirror circuits can be connected thereto to produce the plurality of reference currents.

Figure 8:
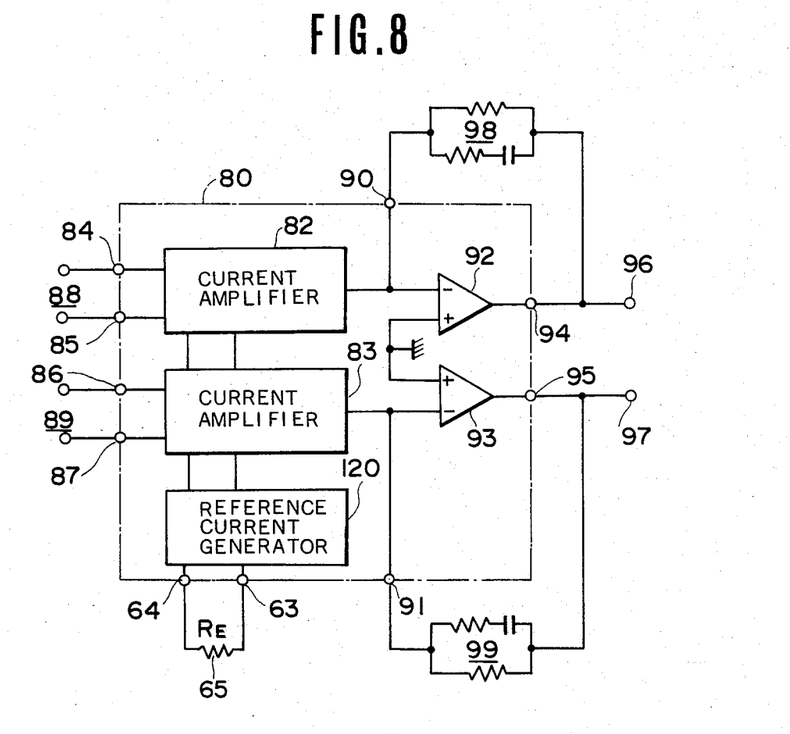
FIG. 8 is a block diagram illustrating an alternate application of a current amplifier in accord with the present invention.

FIG. 8 illustrates one application of a current amplifier in accord with the present invention in which two current amplifier sections or portions 82, 83 are provided in a single integrated circuit 81. Current amplifier sections or portions 82, 83 are provided with input terminals 84, 85 and 86, 87, respectively. The current amplifier sections 82, 83 are also connected to differential input terminal pairs 88, 89, respectively. The output terminals of current amplifier sections 82, 83 are supplied to output terminals 90, 91, respectively, and to the inverting input terminals of operational amplifiers 92, 93, respectively. Output terminals 94, 95 of operational amplifiers 92, 93 are connected to respective signal output terminals 96, 97, and to corresponding output terminals 90, 91 through corresponding feedback circuits 98, 99. A reference current generator 120 is included in integrated circuit 81 and produces internal reference current $I_{RI}$ and external reference current $I_{RE}$ which are supplied to the current amplifier sections 82, 83, respectively.

In operation, a dual channel differential input voltage is supplied to differential input terminal pairs 88, 89 and are converted into output currents by current amplifier sections 82, 83. The output currents are supplied through operational amplifiers 92, 93 and feedback circuits 98, 99 where the desired frequency components are emphasized. The resulting voltage signals are supplied at signal output terminals 96, 97. The voltage gain of the illustrated circuit is independent of the absolute value of the diffused resistance in the integrated circuit. In addition, external reference resistance 65 can be changed to set the gain to a desired value.

Figure 9:
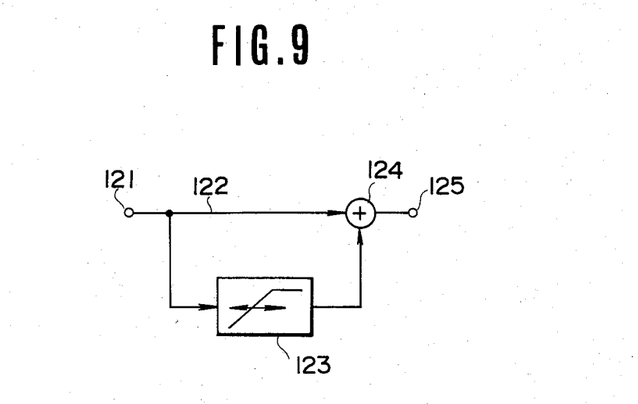
FIG. 9 is a block diagram illustrating a noise reduction circuit.

FIG. 9 illustrates a noise reduction circuit including a current amplifier in accord with the present invention. In the noise reduction circuit of FIG. 9, an input signal from an input terminal 121 is supplied through a main signal path 122 having a gain of unity and flat frequency characteristics and also through an auxiliary signal path 123 essentially comprising a high-pass filter having a variable cut-off frequency. The output signals from main and auxiliary signal paths 122, 123 are summed at a summing point 124 and supplied to an output terminal 125. The cut-off frequency of the high-pass filter included in auxiliary signal path 123 is controlled in response to control signals from a control circuit (not shown) having a signal level sensing circuit. In general, the variable cut-off frequency of the high-pass filter is made up of a filter circuit and a variable resistance circuit comprising a current amplifier in accord with the present invention.

Figure 10:
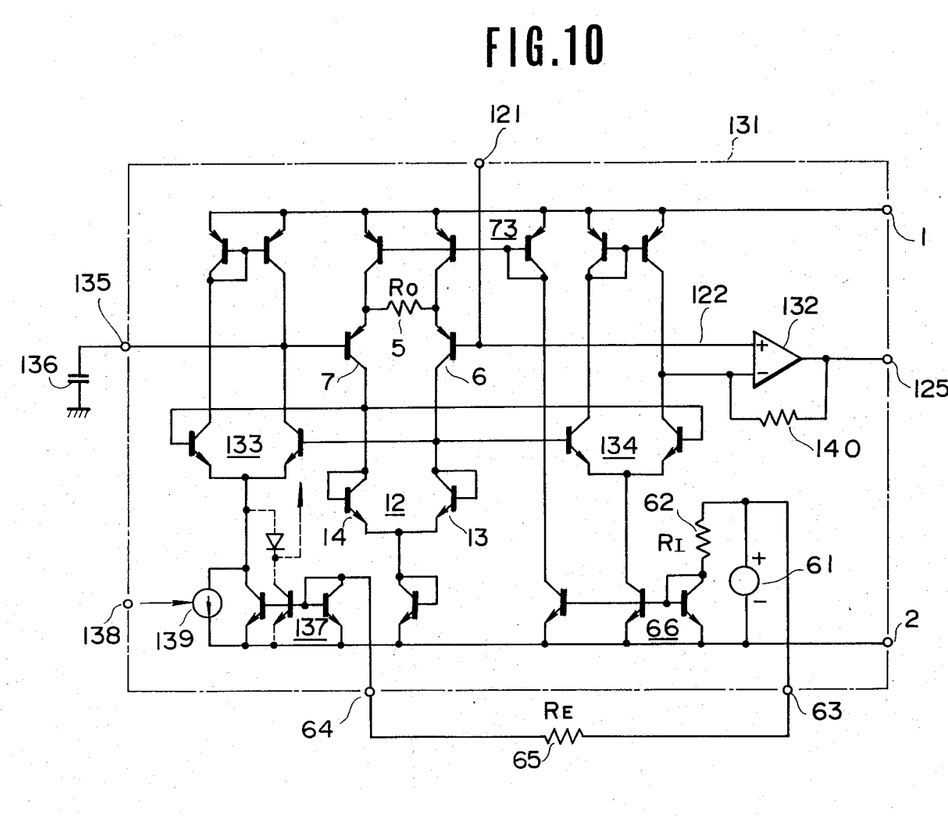
FIG. 10 is a circuit diagram of the noise reduction circuit of FIG. 9 in which a current amplifier in accord with the present invention is used in conjunction with the current amplifier in FIG. 4.

FIG. 10 illustrates a noise reduction circuit in which the current amplifier of FIG. 6 is used as a variable resistance circuit, as illustrated in FIG. 4.

In FIG. 10, the noise reduction circuit of FIG. 9 is included in an integrated circuit 131. A noise reduction operation is performed on the input signal supplied to input terminal 121 before it is supplied at output terminal 125.

The input signal supplied to input terminal 121 is supplied to the base electrode of one of transistors 6, 7 included in the voltage to current converting circuit. The input signal is also supplied through main signal path 122 to a non-inverting input terminal of an operational amplifier 132 functioning as a summing circuit. Two common emitter configuration transistor pairs 133, 134 are connected to PN junction pair 12 at the output of the multiplier circuit and supply output currents. The output terminal of common emitter configuration transistor pair 133 is connected to the base electrode of transistor 7 of the voltage to current converting circuit and to one terminal of a capacitor 136 through a terminal 135 in integrated circuit 131. The other terminal of capacitor 136 is connected to ground.

It should be noted that the voltage to current converting circuit of FIGS. 2 and 3 can also be used in the circuit of FIG. 10, and the noise reduction circuit will operate in a similar fashion.

The current amplifier section comprising the voltage to current converting circuit and a portion of the multiplier circuit, that is, PN junction pair 12 and common emitter configuration transistor pair 133, is so arranged that, as shown in FIG. 4, the output signal of common emitter configuration pair 133 is fed back in a negative fashion to the base electrode of transistor 7 included in the input stage of the voltage to current converting circuit. Thus, it is to be appreciated that this is the equivalent circuit, as viewed from terminal 135, of the variable resistance circuit in FIG. 5. The variable resistance circuit and capacitor 136 comprise a substantially first-order high-pass filter circuit in which the cut-off frequency of the filter circuit is changed by changing the resistance of the variable resistance circuit. The common emitter current of common emitter configuration transistor pair 133 controls the resistance of the variable resistance circuit. In effect, the output of current inverting or current mirror circuit 137, having an input connected to reference current terminal 64, is connected to the common emitter path of common emitter configuration transistor pair 133. A current source 139 is connected in parallel to the output transistor of current inverting circuit 137. Control signals from a control signal input terminal 138 control the current from current source 139. Although a control signal is supplied to control signal input terminal 138 for deriving a control voltage for the auxiliary circuit output, a control circuit therefor does not form a part of the present invention and is not shown in FIG. 10 for the sake of brevity.

The common emitter configuration transistor pair 134 of the multiplier circuit generates a current output corresponding to the voltage difference between terminals 121 and 135 and provides an output signal in the auxiliary signal path having high-pass filter characteristics. The output signal from common emitter configuration transistor pair 134 is supplied to an inverting input terminal of operational amplifier 132 which functions as the aforementioned summing point 124 (see FIG. 9). Operational amplifier 132 acts as a voltage follower with respect to main signal path 122 and as an inverting amplifier with respect to the output signal of the auxiliary signal path forming the current source. The product of the transconductance of the circuit section between input terminal 121 and the output of common emitter configuration transistor pair 134 and the resistance of a negative feedback resistor 140 connected to operational amplifier 132 determines the gain of the auxiliary signal path. Since resistor 140 is formed as a diffused area in the integrated circuit, the transconductance can be selected to be inversely proportional to the absolute value of the diffused resistance. Thus, external reference current $I_{RE}$ determines the common-emitter current of common emitter configuration transistor pair 133. It should be noted that internal reference current $I_{RI}$ determines the common emitter current of common emitter transistor pair 134.

In operation, the cut-off frequency of the auxiliary signal path is lowest in the absence of input signals to input terminal 121, with the current of current source 139 being approximately zero. The common emitter current of common emitter configuration transistor pair 133 is approximately equal to external reference current $I_{RE}$. As can be appreciated from the foregoing description of an embodiment of the present invention, the equivalent resistance of the variable resistance circuit does not depend on the absolute value of the diffused resistance in the integrated circuit. In addition, the cut-off frequency of the auxiliary signal path is not affected by the diffused resistance.

When an input signal is supplied to the circuit of FIG. 10, current flows from current source 139 in response to a control signal from a control circuit (not shown). The cut-off frequency of the auxiliary signal path, predominantly determined by current source 139, increases in response thereto. The cut-off frequency of the auxiliary signal path can be controlled to be independent of the absolute value of the diffused resistance when the input signal is supplied to the device by providing current source 139 in such a manner that the current therefrom is not dependent on the absolute value of the diffused resistance when the control signal is supplied thereto.

From the foregoing, it can be appreciated that a current amplifier in accord with the present invention supplies, from the same reference voltage, an internal reference current inversely proportional to the diffused resistance of the integrated circuit and an external reference current inversely proportional to a reference resistance disposed outside the integrated circuit. It is also to be appreciated that the transconductance of the current amplifier is independent of the absolute value of the diffused resistance. Thus, in the application of such a current amplifier, such as in programmable filter circuits or noise reduction devices of the sliding band type, the circuit gain or frequency characteristics do not depend on the absolute value of the diffused resistance, so that a precise signal can be derived therefrom. Accordingly, an integrated circuit having improved performance can be manufactured under less stringent conditions and at improved yield rate than is possible in prior art current amplifiers.

Although specific embodiments of the present invention have been described in detail herein with reference to the accompanying drawings, it is to be understood that the invention is not limited to those precise embodiments, and that various changes and modifications may be effected therein by one skilled in the art without departing from the spirit and scope of the invention as defined in the appended claims.

What is claimed is:

1. A current amplifier for use with an input voltage comprising:
   converting means for converting said input voltage to output currents and including first and second transistors each having base, emitter and collector electrodes, said base electrodes of said first and second transistors being respectively connected to first and second input terminals receiving said input voltage, third and fourth transistors each having base, emitter and collector electrodes, said base electrodes of said third and fourth transistors being respectively connected to said emitter electrodes of said first and second transistors, each of said third and fourth transistors supplying one of said output currents, resistor means connected between said emitter electrodes of said third and fourth transistors, and bias current means for supplying a bias current to said resistor means; and
   multiplier means for multiplying said output currents from said converting means and including current inverting means and feedback means connected between said converting means and said current inverting means.

2. The current amplifier of claim 1; wherein said multiplier means further includes a common emitter configuration transistor pair connected to said current inverting means.

3. The current amplifier of claim 2; wherein said feedback means comprises fifth and sixth transistors each having base, collector and emitter electrodes, said collector electrodes of said fifth and sixth transistors being respectively connected to said emitter electrodes of said first and second transistors, and said base electrodes of said fifth and sixth transistors being respectively connected to said collector electrodes of said third and fourth transistors.

4. The current amplifier of claim 3; wherein said current inverting means comprises seventh and eighth transistors each having base, collector and emitter electrodes, said collector electrodes of said seventh and eighth transistors being respectively connected to said base electrodes of said fifth and sixth transistors, said base electrodes of said seventh and eighth transistors being respectively connected to said emitter electrodes of said fifth and sixth transistors, and said emitter electrodes of said seventh and eighth transistors being connected together, and ninth and tenth transistors each having base, collector and emitter electrodes, said base and collector electrodes of said ninth and tenth transistors being respectively connected to said base electrodes of said seventh and eighth transistors, and said emitter electrodes of said ninth and tenth transistors being respectively connected to said emitter electrodes of said seventh and eighth transistors.

5. The current amplifier of claim 4; wherein said common emitter configuration transistor pair includes a pair of transistors each having base, emitter, and collector electrodes, said emitter electrodes of said pair of transistors being connected together, and said base electrodes of said pair of transistors being respectively connected to said base electrodes of said seventh and eighth transistors.

6. The amplifier of claim 2; and further comprising a second bias current means in addition to the first mentioned bias current means for supplying a bias current to said common emitter configuration transistor pair of said multiplier means.

7. The amplifier of claim 6; and further comprising current inverting means connected to said common emitter configuration transistor pair.

8. The amplifier of claim 6; wherein said converting means includes starting means connected between said resistor means and said emitter electrodes of said third and fourth transistors.

9. The amplifier of claim 6; wherein said converting means includes second starting means in addition to the first-mentioned starting means for preventing said first and second transistors from turning OFF when said third and fourth transistors are OFF.

10. The amplifier of claim 9; wherein said first starting means includes a pair of transistors each having base, collector, and emitter electrodes, said emitter electrodes thereof being connected to said resistor means and said base electrodes thereof being respectively connected to said base electrodes of said first and second transistors.

11. The amplifier of claim 10; wherein said second starting means includes first and second current means respectively connected to said emitter electrodes of said first and second transistors and to said base electrodes of said third and fourth transistors.

12. The amplifier of claim 6; wherein said first bias current means comprises:
reference voltage source means;
internal reference resistor means connected to said reference voltage source means; and
bias current inverting means connected to said internal reference resistor means and said reference voltage source means.

13. The amplifier of claim 12; wherein said second bias current means comprises:
external reference resistor means connected to said reference voltage source means; and
second bias current inverting means in addition to the first-mentioned bias current inverting means and connected to said external reference resistor means and said multiplier means.

14. The amplifier of claim 13; and further including a third bias current inverting means connected to said first bias current inverting means and said converting means.

15. The amplifier of claim 14; and further comprising:
eleventh and twelfth transistors each having base, emitter and collector electrodes, said emitter electrodes of said eleventh and twelfth transistors being respectively connected to said reference voltage source means;
thirteenth and fourteenth transistors each having base, emitter and collector electrodes, said emitter electrodes of said thirteenth and fourteenth transistors being respectively connected to said base electrodes of said eleventh and twelfth transistors, said emitter electrode of said thirteenth transistor also being connected to said internal reference resistor means and said emitter electrode of said fourteenth transistor also being connected to said external reference resistor means;
fifteenth and sixteenth transistors each having base, emitter and collector electrodes, said emitter electrodes of said fifteenth and sixteenth transistors being respectively connected to said base electrodes of said thirteenth and fourteenth transistors, said base electrodes of said fifteenth and sixteenth transistors being respectively connected to said collector electrodes of said eleventh and twelfth transistors, and said collector electrodes of said fifteenth and sixteenth transistors being respectively connected to said collector electrodes of said thirteenth and fourteenth transistors, said collector electrode of said fifteenth transistor also being connected to said first bias current inverting means and said collector electrode of said sixteenth transistor also being connected to said second bias current inverting means;
first current source means connected to said base electrode of said fifteenth transistor; and
second current source means connected to said base electrode of said sixteenth transistor.

16. A current amplifier for use with an input voltage comprising:
converting means for converting said input voltage to first and second output currents and including first and second transistors each having base, emitter and collector electrodes, said base electrodes of said first and second transistors being respectively connected to first and second input terminals receiving said input voltage, third and fourth transistors each having base, emitter and collector electrodes, said base electrodes of said third and fourth transistors being respectively connected to said emitter electrodes of said first and second transistors, said third and fourth transistors supplying said first and second output currents, respectively, resistor means connected between said emitter electrodes of said third and fourth transistors, and bias current means for supplying a bias current to said resistor means; and
multiplier means for multiplying said first and second output currents and including fifth and sixth transistors each having base, emitter and collector electrodes, said collector electrodes of said fifth and sixth transistors being respectively connected to said emitter electrodes of said first and second transistors, said base electrodes of said fifth and sixth transistors being respectively connected to said collector electrodes of said third and fourth transistors, seventh and eighth transistors each having base, emitter and collector electrodes, said collector electrodes of said seventh and eighth transistors being respectively connected to said base electrodes of said fifth and sixth transistors, said base electrodes of said seventh and eighth transistors being respectively connected to said emitter electrodes of said fifth and sixth transistors, said emitter electrodes of said seventh and eighth transistors being connected together, ninth and tenth transistors each having base, emitter and collector electrodes, said base electrodes and said collector electrodes of said ninth and tenth transistors being respectively connected to said base electrodes of said seventh and eighth transistors, and a common emitter configuration transistor pair, each transistor of said pair having base, emitter and collector electrodes, said base electrodes of said transistors of said pair being respectively connected to said base electrodes of said seventh and eighth transistors.

17. The current amplifier of claim 16; wherein said first, second, fifth, sixth, seventh, eighth, ninth and tenth transistors are of a first conductivity type and said third and fourth transistors are of a second conductivity type.

18. The current amplifier of claim 17; wherein said first conductivity type of transistor is a PNP type of transistor and said second conductivity type of transistor is an NPN type of transistor.

19. The current amplifier of claim 17; wherein said first conductivity type of transistor is an NPN type of transistor and said second conductivity type of transistor is a PNP type of transistor.

* * * * *